(12) United States Patent
Takano et al.

(10) Patent No.: US 6,482,775 B2
(45) Date of Patent: *Nov. 19, 2002

(54) OXIDE SUPERCONDUCTOR

(75) Inventors: Mikio Takano, 17, Higashiuracho, Yasui, Uzumasa, Ukyo-ku, Kyoto-shi, Kyoto 616 (JP); Zenji Hiroi, Room 231, Kyodaishokuinshukusha, Gokasho-kanyuchi, Uji-shi, Kyoto 611 (JP); Yoshichika Bando, 8-15, Koyocho, Otsu-shi, Shiga 520-02 (JP); Takahito Terashima, 26-6-902, Koriminaminocho, Neyagawa-shi, Osaka 572 (JP); Kohji Kishio, 1-12-1-E-208, Shinkashiwa, Kashiwa-shi, Chiba 277 (JP); Junichi Shimoyama, 12-7-321, Oshiage 2-chome, Sumida-ku, Tokyo 131 (JP); Koichi Kitazawa, 1-20-6-1301, Mukogaoka, Bunkyo-ku, Tokyo 113 (JP); Jun Takada, 14-10, Shimizu 1-chome, Okayama-shi, Okayama 703 (JP); Iksu Chong, Uji (JP)

(73) Assignees: Mikio Takano, Kyoto (JP); Zenji Hiroi, Uji (JP); Yoshichika Bando, Otsu (JP); Takahito Terashima, Neyagawa (JP); Kohji Kishio, Kashiwa (JP); Junichi Shimoyama, Tokyo (JP); Koichi Kitazawa, Tokyo (JP); Jun Takada, Okayama (JP); Sumitomo Electric Industries, Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/355,304

(22) PCT Filed: Jan. 28, 1998

(86) PCT No.: PCT/JP98/00333

§ 371 (c)(1), (2), (4) Date: Jul. 28, 1999

(87) PCT Pub. No.: WO98/32697

PCT Pub. Date: Jul. 30, 1998

(65) Prior Publication Data

US 2002/0121630 A1 Sep. 5, 2002

(30) Foreign Application Priority Data

Jan. 29, 1997 (JP) .............................................. 9-015148

(51) Int. Cl.$^7$ ........................ C04B 101/00; H01L 39/12; H01B 12/00
(52) U.S. Cl. ....................................... 505/121; 505/782
(58) Field of Search .................................. 505/121, 125, 505/782

(56) References Cited

FOREIGN PATENT DOCUMENTS

| JP | 7-141940 | 6/1995 |
|----|----------|--------|
| JP | 7-172834 | 7/1995 |
| JP | 8-225327 | 9/1996 |

OTHER PUBLICATIONS

"Effects of Cation Substitution on the Magnetization for Bi–2212 Phase" by M. Wakata, S. Takano, F. Munakata, and H. Yamauchi; Published in Advances in Superconductivity—IV, Proceedings of the 4th International Symposium on Superconductivity (ISS '91), Oct. 14–17, 1991.

*Primary Examiner*—Mark Kopec
(74) *Attorney, Agent, or Firm*—McDermott, Will & Emery

(57) ABSTRACT

An oxide superconductor consisting of an oxide which comprises, as constituent metal elements, bismuth, lead, strontium, calcium and copper having a molar ratio of lead to bismuth of at least 0.2:1, and having an internal structure in which domains having a relatively high concentration of lead and no long-period structure are contained in domains having a relatively low concentration of lead and a long-period structure. This oxide superconductor has a storing pinning function and a high critical current density Jc even at a high temperature and a high magnetic field, can be produced by industrial methods, and is easily processed to form wires.

7 Claims, 4 Drawing Sheets

OXIDE SUPERCONDUCTOR

This application in the national phase of international application PCT/JP98/00333 filed Jan. 28, 1998 which designated the U.S.

FIELD OF THE INVENTION

The present invention relates to a novel oxide superconductor. In particular, the present invention relates to an oxide superconductor consisting of an oxide which comprises, as constituent metal elements, bismuth, lead, strontium, calcium and copper, and has excellent critical current characteristics in a magnetic field.

The novel oxide superconductor of the present invention finds a wide variety of applications such as magnets, cables, various devices, etc.

BACKGROUND ART

Hitherto, a number of oxide-base high temperature superconductors have been found. However, all such superconductors have a structure in which superconductive layers consisting of copper-oxygen planes, and non-superconductive layers are alternately laminated, and their electrical magnetic properties have a large anisotropy reflecting such a structure. The crystal systems of such oxide superconductors are tetragonal or orthorhombic, and the copper-oxygen planes form ab planes. A large superconductive current can flow in the direction of such planes, while little current flows in the direction of the c-axis.

Large-sized oxide-base high temperature superconductive materials consist of polycrystals. In such a case, to flow a large superconductive current, the ab planes of the crystals should be aligned, that is, the crystals are oriented, and the current is allowed to flow in parallel with the ab planes.

Bismuth-base superconductors have the very large anisotropy of crystal growth rates, and thus the ab planes of the crystals, in which a superconductive current easily flows, grow in the form of a thin plate. Therefore, it is easy to mechanically orient crystals, or to orient crystals during the growth of crystals from a melt by making use of the anisotropy of the surface or interface energy.

Among bismuth-base superconductors, the Bi2212 and Bi2223 phases, which have high critical temperatures (Tc), have been developed as industrial materials. The ratio of bismuth:strontium:calcium:copper in the latter phase is about 2:2:1:2, while such a ratio in the latter phase is about 2:2:2:3. In the latter phase, 10 to 20 atomic % of lead is replaced with bismuth for the acceleration of the crystal growth and the stabilization of the structure.

The development of wires using such bismuth-base superconductive materials is one of the most advanced areas among the oxide high temperature superconductive materials, because of the easy orientation of crystals. In the case of the Bi2212 phase, a wire, which has a thickness of several ten to several hundred micrometers and consists of plate-form crystals having dense and oriented structures, has been developed by a melting-solidification process on a tape-formmetal substrate or in a metal sheath. In the case of the Bi2223 phase, a tape-form metal sheathed wire has been developed, in which the crystals are mechanically oriented in the course of a cold work.

The critical current density (Jc) of such a wire in the absence of a magnetic field is several ten thousand $A/cm^2$ at the liquid nitrogen temperature (77K), or several hundred thousand $A/cm^2$ at a low temperature of 30K or less. These values are on the highest level among the oxide high temperature superconductors having a length of several meters or longer, and come up to a practical level. At present, current leads, superconductive cables, superconductive magnet devices which can operate at 20K or less, and the like are developed using such wires, and come into practical use.

The characteristics of superconductive materials from the viewpoint of applications in the heavy electric industry are that a large amount of a current is allowed to flow through the materials at a high current density without loss and, in this connection, they can generate a strong magnetic field of several teslas or larger. Conventional (classical) metal superconductors inevitably require cooling with liquid helium which is expensive and a valuable resource, since they have a low Tc. However, oxide high temperature superconductors can find applications which require economical and easy cooling with liquid nitrogen or by refrigerators. Therefore, it is expected that superconductive equipment will widely spread. Furthermore, oxide high temperature superconductors are expected to find many applications in the technical fields, which are in a magnetic field or which generate a magnetic field, rather than applications such as cables, etc. in the absence of a magnetic field.

As stated above, bismuth-based superconductors have a large anisotropy of crystal growth rates and thus their oriented structures can be easily attained. Thus, their application as materials are most advanced, and it may be possible to greatly expand the market of superconductors, if the applications at high temperature in a magnetic field are developed using bismuth-based superconductors.

However, among oxide superconductors, bismuth-based superconductors are typical materials having a very large electrical magnetic anisotropy, that is, a very weak bond between superconductive layers. Thus, a magnetic flux is hardly pinned in a superconductor in a magnetic field in parallel with the c-axis of a crystal, and the magnetic flux is shifted even by a little current, so that a finite resistance is generated in the superconductor. The influence of thermal fluctuation is small, and pinning effectively functions at a low temperature, and superconductors have a sufficiently high Jc (critical current density) in a high magnetic field. However, at a temperature of 30K or higher, a magnetic flux very easily moves, and thus Jc sharply drops in a magnetic field. Accordingly, bismuth-based superconductors exhibit practically sufficient Jc only in a very small magnetic field at a high temperature such as the liquid nitrogen temperature. For example, in the case of a Bi2212 phase wire, the intensity of a magnetic field at which Jc becomes 0 (zero) (irreversible magnetic field) is only 0.02 tesla in a magnetic field in parallel with the c-axis at the liquid nitrogen temperature. In addition, in the case of other oxide superconductors having a stronger pinning function, a material having a long length and high Jc has not been developed, since it is difficult to control the orientation of crystals.

Many attempts have been made to improve the pinning property of bismuth-based superconductors. The introduction of artificial defects by the irradiation with heavy ions or neutrons, which is most effective, is not an industrially applicable method, while the inclusion of Ti, Zr, Hf, etc. in crystals cannot improve the characteristics of superconductors to practical levels.

It is necessary to introduce effective pinning centers to improve the Jc characteristics of bismuth-based superconductors in a magnetic field. From the practical viewpoint, chemical or mechanical methods are desirable to introduce pinning centers. Examples of pinning centers include non-superconductive deposits, structural defects, grain boundaries of crystals, etc. Since the crystals of bismuth-based superconductors are in the form of thin plates, it is difficult to intentionally add impurities to the superconductors and introduce conductive deposits in the inside of crystals, while the grain boundaries function as weak pinning centers.

Yttrium- or lanthanum-based superconductors have weak superconductivity around oxygen defects, and the superconductivity is broken near the oxygen defects in a magnetic field having a certain intensity. Such a phenomenon is used to improve a pinning power. However, in the case of bismuth-based superconductors, an essential pinning function is not improved, although anisotropic electrical magnetic characteristics are more or less improved by controlling the amount of oxygen.

DISCLOSURE OF THE INVENTION

The present inventors have found that, when a part of bismuth atoms are replaced by lead atoms in the Bi2212 phase of a bismuth-based superconductor, domains having a high lead concentration and domains having a low lead concentration form throughout crystals so that plate-form or columnar internal structures form at a lead-rich composition in which a molar ratio of lead to bismuth is 0.2:1 or larger.

According to the first aspect of the invention, there is provided an oxide superconductor consisting of an oxide which comprises, as constituent metal elements, bismuth, lead, strontium, calcium and copper having a molar ratio of lead to bismuth of at least 0.2:1, preferably from 0.2:1 to 0.7:1, and has a high irreversible magnetic field and a high critical current density.

According to the second aspect of the present invention, there is provided an oxide superconductor consisting of an oxide which comprises, as constituent metal elements, bismuth, lead, strontium, calcium and copper, and has a domain structure comprising domains M having a long-period structure with a period of at least 30 Å, preferably from 30 to 80 Å, in the direction of the b-axis, and domains N having no long-period structure.

Preferably, the oxide superconductors according to the second aspect of the invention has (A) a layered internal structure in which plate-form crystalline domains N having a thickness of about 50 to 1,000 Å and a relatively high lead concentration, and plate-form crystalline domains M having a thickness of about 100 to 2,000 Å and a relatively low lead concentration are alternately laminated in the direction of the b-axis of the crystal, or in a direction which slants from the b-axis towards the a-axis (for example, a direction which slants by 0 to 60 degrees from the b-axis), (B) a columnar internal structure in which columnar or cylindroidal crystalline domains having a diameter of about 100 to 2,000 Å and a relatively high lead concentration are present at an interval of about 100 to 2,000 Å in a matrix crystalline domain M having a relatively low lead concentration, or (C) both the layered internal structure (A) and the columnar internal structure (B).

In each case, the lead concentration in the domains N is higher than that in the domain or domains M.

EMBODIMENTS OF THE INVENTION

In the oxide superconductor of the present invention, a ratio of (bismuth+lead):strontium:calcium:copper is 2:2:1:2 or around such a ratio. For example, a preferred elemental composition can be represented by the formula:

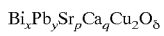

$$Bi_xPb_ySr_pCa_qCu_2O_\delta$$

wherein δ is a number of 7 to 9, preferably 7.5 to 8.5; and x, y, p and q are each a positive number, provided that the sum of x and y is from 1.8 to 2.5, preferably from 1.8 and 2.2, in particular 2; the ratio of y to x (y:x) is at least 0.2:1, preferably from 0.2:1 to 0.7:1, and the sum of p and q is from 2.5 to 3.5, preferably 3, and the ratio of p to q (p:q) is preferably 2:1.

Figure 1:
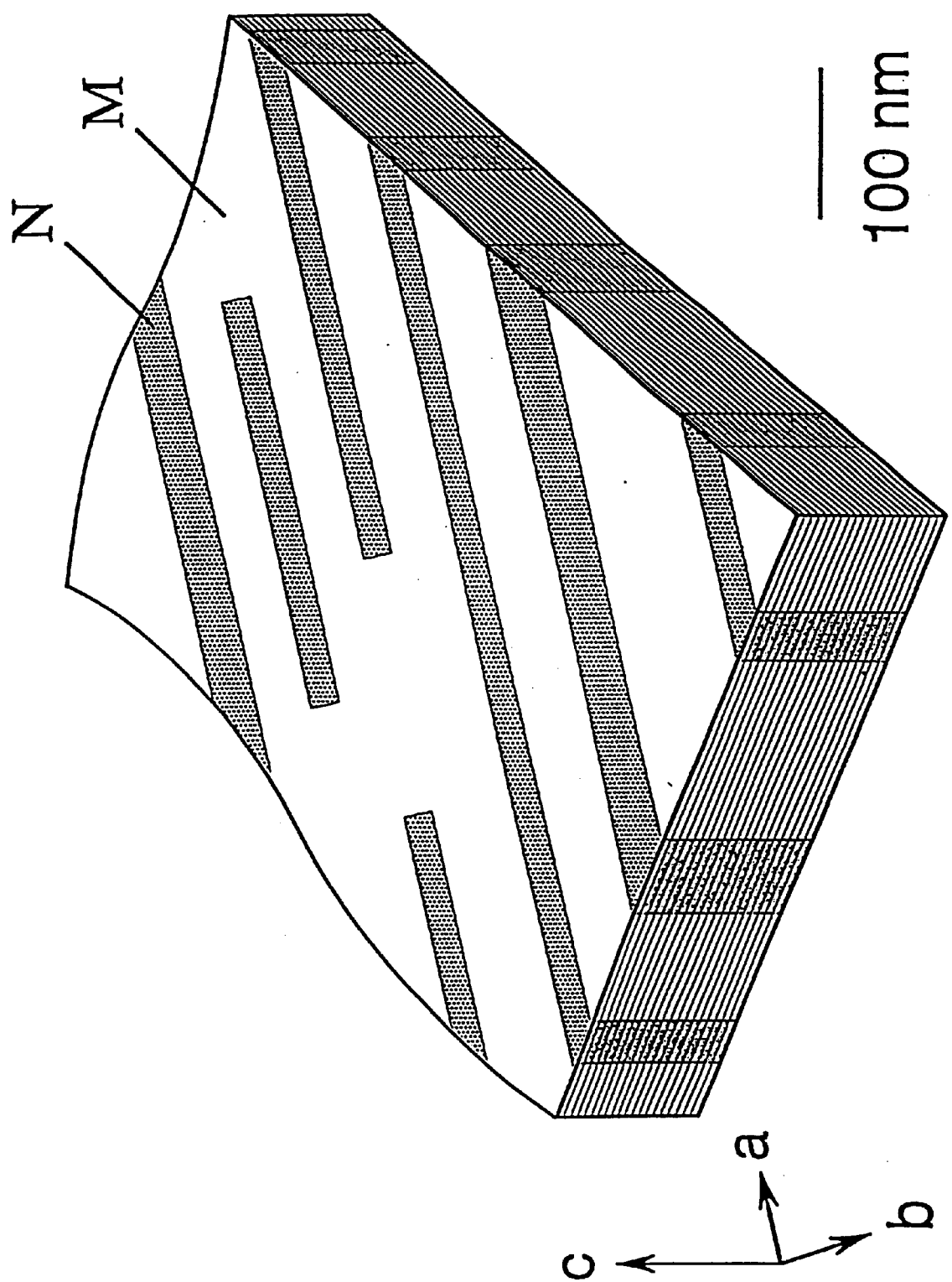
FIG. 1 is an enlarged schematic partial view of one example of the crystal structure of an oxide superconductor according to the present invention.
Figure 2:
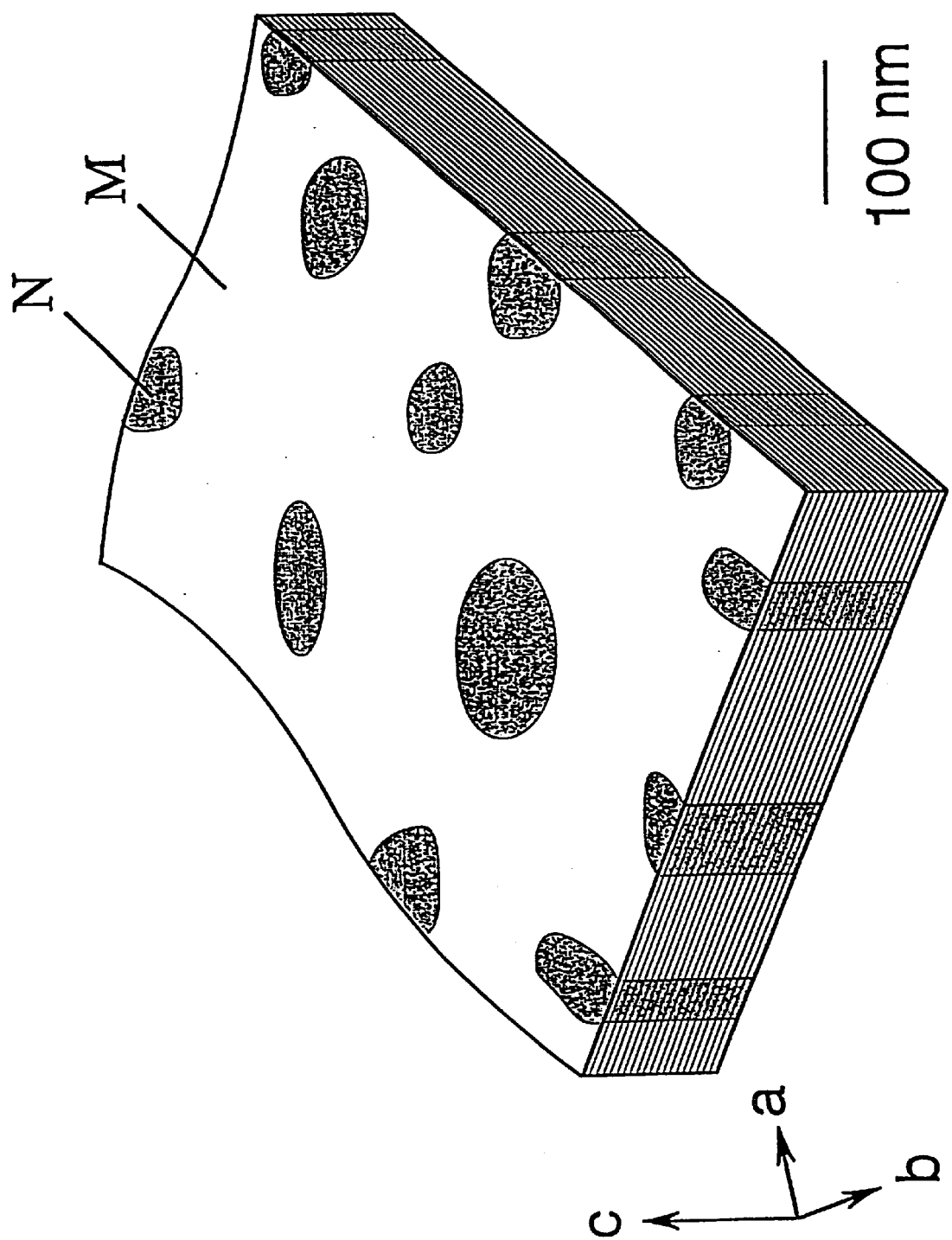
FIG. 2 is an enlarged schematic partial view of another example of the crystal structure of an oxide superconductor according to the present invention.

FIGS. 1 and 2 are enlarged schematic partial views of examples of the crystal structure of the oxide superconductor according to the present invention. In FIGS. 1 and 2, the domains N in which a lead concentration is high are shown by gray domains. Such internal structures can be clearly observed with a transmission electron microscope. See undermentioned Examples, and FIGS. 3 and 4.

In the domains N having a high lead concentration and the domain M having a low lead concentration shown in FIG. 1, directions perpendicular to the planes of such domains are in parallel with the direction of the b-axis, or slant by 0 to 60 degrees from the b-axis towards the a-axis. The thicknesses of the domains N and domains M are about 50 to 1,000 Å, and about 100 to 2,000 Å, respectively.

The domains N having a high lead concentration shown in FIG. 2 have columnar or cylindroidal structures which extend in a direction substantially perpendicular to the ab plane. The diameter of such domains is about 100 to 2,000 Å.

Such domain structures have interfaces which are perpendicular to the ab plane, or slightly slant from the ab plane. Thus, the interfaces function as effective pinning centers against a magnetic field in parallel with the c-axis, and thus the superconductors of the present invention exhibit a high Jc even at a high temperature in a high magnetic field.

It has been confirmed that the oxide superconductor of the present invention has a Jc which is several times to several ten times larger than that of conventional bismuth-based superconductors, and an irreversible magnetic field, at a high temperature of 30K or higher. In particular, an irreversible magnetic field reaches 0.1 tesla at the highest even at the liquid nitrogen temperature (77K). This indicates that it is possible to assemble a several-tesla grade superconductive magnet cooled with liquid nitrogen, which is designed so that a generated magnetic field is as in parallel with the ab plane as possible (the magnetic field component in the c-axis being at most several percents of the central magnetic field).

The oxide superconductor of the present invention may be prepared by substantially the same methods as the preparation methods of conventional bismuth-based oxide superconductors except that the amounts of raw materials are adjusted so that the molar ratio of lead to bismuth is in the range defined by the present invention.

The replacement with lead is a chemical process which can be carried by a general thermal treatment method. Thus, a conventional wire-production method can be readily employed. Accordingly, materials and superconductive equipment, which exhibit good properties at a high temperature in a high magnetic field, can be obtained.

The bismuth-based superconductor of the present invention has a high Jc even at a high temperature in a high magnetic field, since it contains lead at a high concentration as a whole, the concentration of lead varies from domain to domain, and the interfaces between the domains having a high lead concentration and the domains having a low lead concentration function as pinning centers.

EXAMPLES

Example 1

Bismuth oxide, lead oxide, strontium carbonate, calcium carbonate and copper oxide were weighed so that a molar ratio of bismuth:lead:strontium:calcium:copper was 1.6:0.6:2:1:2 (lead:bismuth 0.375:1), and mixed. Then, the mixture was calcined at 820° C. in an air for 48 hours.

The sintered powder was press molded in the form of a cylinder having a diameter of 6 mm, and heated by a floating-zone melting method using an infrared condensing furnace to form a single crystal. The obtained single crystal was cleaved and cut to obtain three pieces each having a size of 1 mm×1 mm×0.05 mm, which are labeled A, B and C, respectively.

Samples A and B were sealed in a respective quartz tube under 1 atm. of oxygen and 0.0001 atm. of oxygen, respectively. Sample A was heated at 400° C. for 48 hours, while Sample B was heated at 600° C. for 24 hours, and then the both samples were quenched. Sample C was not annealed.

The critical temperatures of Samples A, B and C, which were obtained from the change of susceptibility depending on temperature, were 67K, 83K and 87K, respectively.

The Jc values of Samples A, B and C, which were measured by a magnetization method at 40K in a magnetic field of 0.1 tesla in parallel with the c-axis, were 80,000 A/cm$^2$, 70,000 A/cm$^2$ and 70,000 A/cm$^2$, respectively.

The irreversible magnetic fields of Samples B and C at the liquid nitrogen temperature (77K) were 0.1 tesla and 0.05 tesla, respectively.

Figure 3:
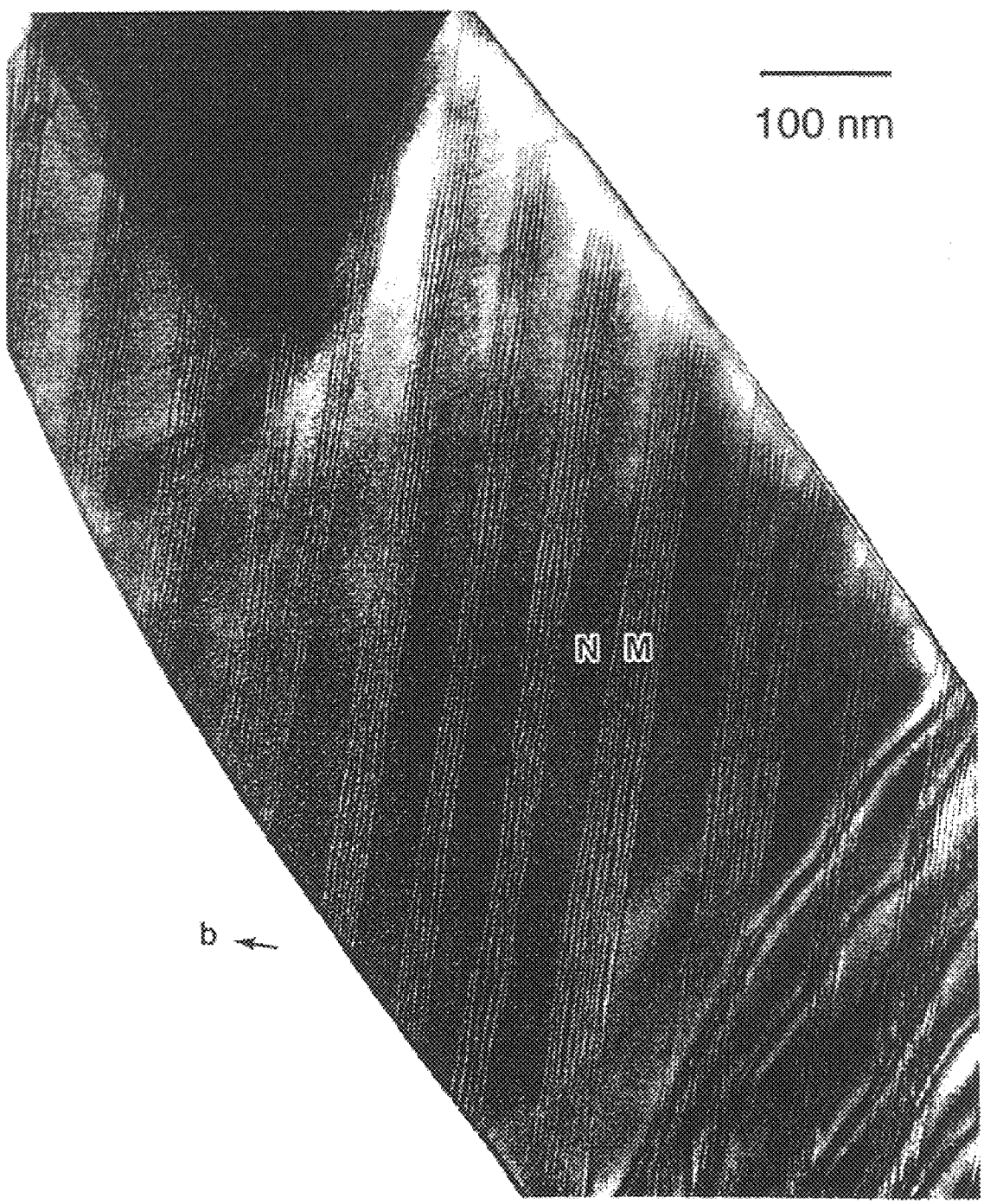
FIG. 3 is a high-resolution electron micrograph of the crystal structure of the oxide superconductor obtained in Example 1.

Samples A, B and C were observed with a transmission electron microscope. All the samples had a structure as shown in FIG. 3, in which domains having a high concentration of lead and no long-period structure (in FIG. 3, the band-form domains N having no stripes) and domains having a low concentration of lead and a long-period structure (in FIG. 3, the band-form domains M having stripes) were alternately laminated in the direction of the b-axis. Here, FIG. 3 is a transmission electron micrograph of Sample C.

Example 2

Bismuth oxide, lead oxide, strontium carbonate, calcium carbonate and copper oxide were weighed so that a molar ratio of bismuth:lead:strontium:calcium:copper was 1.5:0.7:2:1:2 (lead:bismuth=0.467:1), and mixed. Then, the mixture was calcined at 820° C. in an air for 48 hours.

The sintered powder was press molded in the form of a cylinder having a diameter of 6 mm, and heated by a floating-zone melting method using an infrared condensing furnace to form a single crystal. The obtained single crystal was cleaved and cut to obtain a piece having a size of 1 mm×1 mm×0.05 mm.

The critical temperatures of the sample, which was obtained from the change of susceptibility depending on temperature, was 85K.

The Jc value of the sample, which was measured by a magnetization method at 30K in a magnetic field of 0.1 tesla in parallel with the c-axis, was 200,000 A/cm$^2$.

Figure 4:
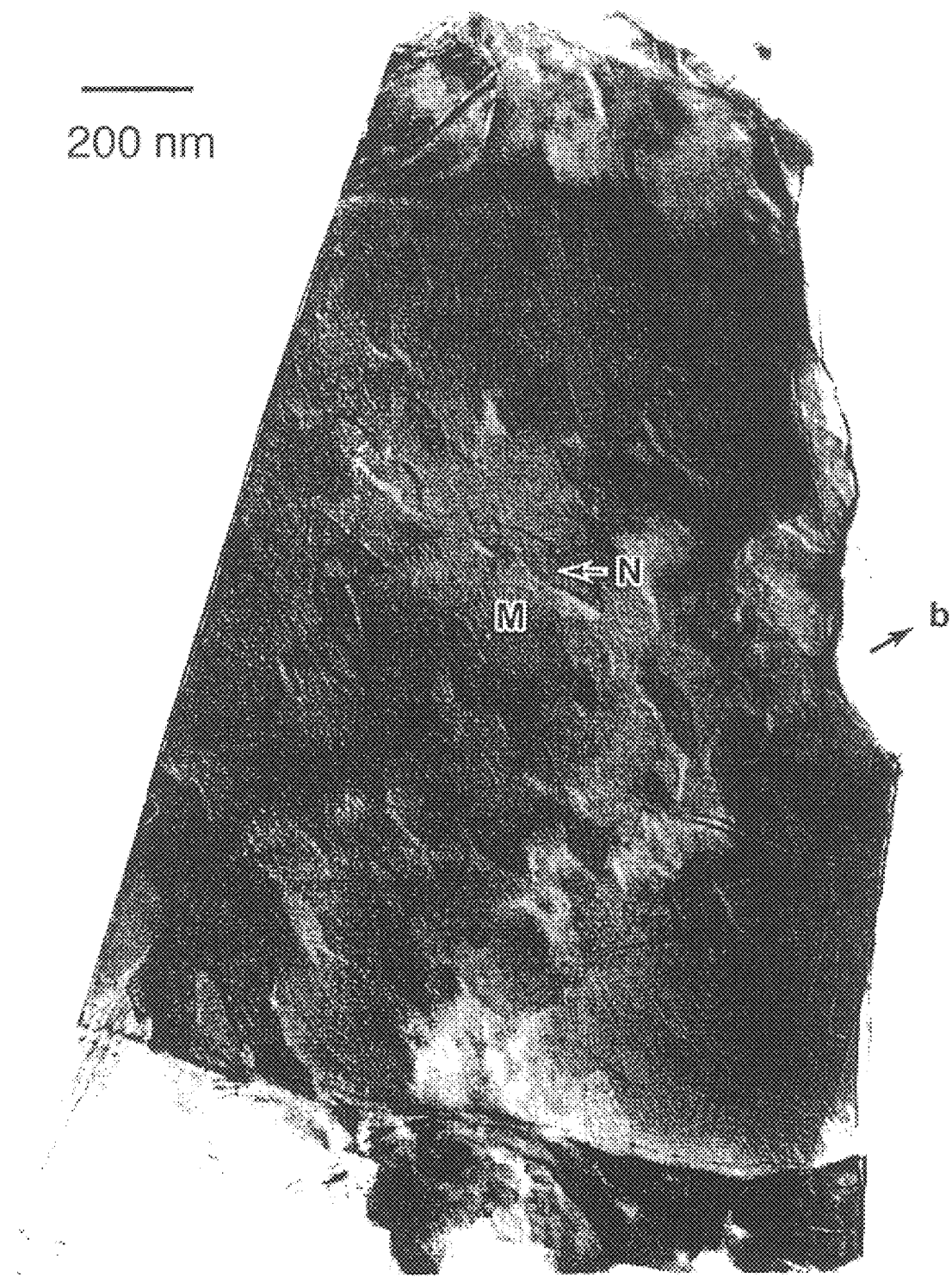
FIG. 4 is a high-resolution electron micrograph of the crystal structure of the oxide superconductor obtained in Example 2.

The sample was observed with a transmission electron microscope. The sample had a structure as shown in FIG. 4, in which the domains having a high concentration of lead and no long-period structure (in FIG. 4, the domains N having no stripes) were grown in the domain having a low concentration of lead and a long-period structure (in FIG. 4, the domain M having stripes) in the direction perpendicular to the ab plane.

Comparative Example 1

Bismuth oxide, lead oxide, strontium carbonate, calcium carbonate and copper oxide were weighed so that a molar ratio of bismuth:lead:strontium:calcium:copper was (2.2−z):z:2:1:2 (z =0 or 0.2), and mixed. Then, the mixture was calcined at 820° C. in an air for 48 hours.

The sintered powder of each composition was press molded in the form of a cylinder having a diameter of 6 mm, and heated by a floating-zone melting method using an infrared condensing furnace to form a single crystal. The obtained single crystal was cleaved and cut to obtain three pieces each having a size of 1 mm×1 mm×0.05 mm, for each composition.

The first sample of each composition was sealed in a quartz tube under 1 atm. of oxygen, and heated at 400° C. for 48 hours (Thermal treatment a), while the second sample of each composition was sealed in a quartz tube under 0.0001 atm. of oxygen and heated at 600° C. for 24 hours (Thermal treatment b). Then, the both samples were quenched. The third samples of the both compositions were not annealed.

The critical temperatures of the samples having the composition in which z is zero (0) were 72K and 87K after Thermal treatments a and b, respectively. The critical temperature of the unannealed sample was 82K.

The Jc value of the sample subjected to Thermal treatment a, which was measured by a magnetization method at 40K in a magnetic field of 0.1 tesla in parallel with the c-axis, was 1500 A/cm$^2$, while the Jc values of the sample which was subjected to Thermal treatment b and the unannealed sample were both zero (0) at 40K in the magnetic field of 0.1 tesla.

The critical temperatures of the samples having the composition in which z is 0.2 were 73K and 88K after Thermal treatments a and b, respectively. The critical temperature of the unannealed sample was 82K.

The Jc value of the sample subjected to Thermal treatment a, which was measured by a magnetization method at 40K in a magnetic field of 0.1 tesla in parallel with the c-axis, was 1600 A/cm$^2$, while the Jc value of the sample subjected to Thermal treatment b and the unannealed sample were both zero (0) at 40K in the magnetic field of 0.1 tesla.

The microstructures of the samples were observed with a transmission electron microscope. All the samples for Z=0 and 0.2 had a long-period structure with a uniform period throughout the entire samples.

What is claimed is:

1. An oxide superconductor comprising, as constituent metal elements, bismuth, lead, strontium, calcium and copper, and having a domain structure comprising first domains M having a long-period structure with a period of a least 30 Å in the direction of the b-axis, and second domains N having no long-period structure, wherein the molar ratio of lead to bismuth in the oxide superconductor is at least 0.2:1.

2. An oxide superconductor according to claim 1, wherein a lead concentration in the domains N is larger than that in the domains M.

3. An oxide superconductor according to claim 1, which has an elemental composition represented by the formula:

$$Bi_xPb_ySr_pCa_qCu_2O_\delta$$

wherein δ is a number of 7 to 9; and x, y, p and q are each a positive number, provided that the sum of x and y is from 1.8 to 2.5; the ratio of y to x (y:x) is from 0.2:1 to 0.7:1, and the sum of p and q is from 2.5 to 3.5.

4. An oxide superconductor according to claim 1, having a layered internal structure in which plate-form crystalline domains N having a thickness of about 50 to 1,000 Å and a relatively high lead concentration, and plate-form crystalline domains M having a thickness of about 100 to 2,000 Å and a relatively low lead concentration are alternately laminated in the direction of the b-axis of the crystal, or in a direction which slants from the b-axis towards the a-axis.

5. An oxide superconductor according to claim 1, having a columnar internal structure in which columnar or cylindroidal crystalline domains having a diameter of about 100 to 2,000 Å and a relatively high lead concentration are present at an interval of about 100 to 2,000 Å in a matrix crystalline domain M having a relatively low lead concentration.

6. An oxide superconductor according to claim 1, having a layered internal structure in which plate-form crystalline domains N having a thickness of about 50 to 1,000 Å and a relatively high lead concentration, and plate-form crystalline domains M having a thickness of about 100 to 2.000 Å and a relatively low lead concentration are alternatively laminated in the direction of the b-axis of the crystal, or in a direction which slants from the b-axis towards the a-axis, and where the crystalline domains M contain columnar or cylindroidal crystalline domains having a diameter of about 100 to 2,000 Å and a relatively high lead concentration, and where the crystalline domains M are present at an interval of about 100 to 2.000 Å.

7. The oxide superconductor of claim 1, wherein said long-period structure has a period in the range of 30–80 Å in the direction of the b-axis.

* * * * *